United States Patent
Boesch et al.

(10) Patent No.: US 8,904,819 B2
(45) Date of Patent: *Dec. 9, 2014

(54) EVAPORATOR WITH INTERNAL RESTRICTION

(71) Applicant: Samsung Display Co., Ltd., Yongin (KR)

(72) Inventors: Damien Boesch, Mountain View, CA (US); Martin Rosenblum, Menlo Park, CA (US)

(73) Assignee: Samsung Display Co., Ltd., Yongin (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/070,854

(22) Filed: Nov. 4, 2013

(65) Prior Publication Data
US 2014/0050863 A1    Feb. 20, 2014

Related U.S. Application Data

(63) Continuation of application No. 12/650,586, filed on Dec. 31, 2009, now Pat. No. 8,590,338.

(51) Int. Cl.
| | |
|---|---|
| *F25B 41/06* | (2006.01) |
| *F25B 39/02* | (2006.01) |
| *F16L 5/00* | (2006.01) |
| *F24C 7/10* | (2006.01) |
| *A21B 1/00* | (2006.01) |
| *A62C 31/02* | (2006.01) |
| *C23C 16/448* | (2006.01) |
| *B05B 17/06* | (2006.01) |
| *B01B 1/06* | (2006.01) |
| *C23C 16/455* | (2006.01) |
| *C23C 14/24* | (2006.01) |

(52) U.S. Cl.
CPC ....... *C23C 16/45563* (2013.01); *C23C 16/4485* (2013.01); *B05B 17/06* (2013.01); *B01B 1/06* (2013.01); *C23C 14/243* (2013.01); *Y10S 165/911* (2013.01)
USPC .................. 62/527; 165/911; 62/515; 62/517; 285/201; 285/205; 285/208; 219/386; 219/399; 219/397; 239/589; 118/726; 118/727; 427/248.1

(58) Field of Classification Search
CPC ................................ F25B 39/02; F25B 41/06
USPC ............. 165/911; 62/515, 517, 527; 285/201, 285/205, 208; 219/386, 399, 397; 239/589; 118/726, 727; 427/248.1
See application file for complete search history.

(56) References Cited

U.S. PATENT DOCUMENTS

| | | |
|---|---|---|
| 2,382,432 A | 8/1945 | McManus et al. |
| 2,384,500 A | 9/1945 | Stoll |

(Continued)

FOREIGN PATENT DOCUMENTS

| | | |
|---|---|---|
| BE | 704297 | 2/1968 |
| CA | 2 353 506 | 5/2000 |

(Continued)

OTHER PUBLICATIONS

De Gryse, R. et al., "Sputtered Transparent Barrier Layers," Tenth International Conference on Vacuum Web Coating (Edited by R. Bakish) aka the $10^{th}$ Bakish Conference; 1996; pp. 190-198.

(Continued)

*Primary Examiner* — Frantz Jules
*Assistant Examiner* — Erik Mendoza-Wilkenfe
(74) *Attorney, Agent, or Firm* — Dinsmore & Shohl LLP

(57) ABSTRACT

An evaporator includes a vaporization chamber having a monomer inlet and a vapor outlet. There is a vapor nozzle in the vapor outlet. The evaporator also includes a collar positioned between the vaporization chamber and the vapor nozzle which increases the pressure in the evaporation chamber while the conductance through the nozzle is substantially unchanged.

16 Claims, 1 Drawing Sheet

(56) References Cited

U.S. PATENT DOCUMENTS

| | | | |
|---|---|---|---|
| 2,490,547 | A * | 12/1949 | Schraner et al. .............. 392/399 |
| 2,707,868 | A * | 5/1955 | Goodman .................... 62/196.4 |
| 2,939,487 | A * | 6/1960 | Fraser et al. .................... 138/45 |
| 3,475,307 | A | 10/1969 | Knox et al. |
| 3,496,427 | A | 2/1970 | Lee |
| 3,607,365 | A | 9/1971 | Lindlof |
| 3,661,117 | A | 5/1972 | Cornelius et al. |
| 3,864,938 | A * | 2/1975 | Hayes, Jr. ....................... 62/504 |
| 4,061,835 | A | 12/1977 | Poppe et al. |
| 4,098,965 | A | 7/1978 | Kinsman |
| 4,266,223 | A | 5/1981 | Frame |
| 4,283,482 | A | 8/1981 | Hattori et al. |
| 4,313,254 | A | 2/1982 | Feldman et al. |
| 4,349,723 | A * | 9/1982 | Swiatosz ....................... 392/399 |
| 4,396,059 | A * | 8/1983 | Banner et al. .............. 165/134.1 |
| 4,426,275 | A | 1/1984 | Meckel et al. |
| 4,521,458 | A | 6/1985 | Nelson |
| 4,537,814 | A | 8/1985 | Itoh et al. |
| 4,555,274 | A | 11/1985 | Kitajima et al. |
| 4,557,978 | A | 12/1985 | Mason |
| 4,572,842 | A | 2/1986 | Dietrich et al. |
| 4,581,337 | A | 4/1986 | Frey et al. |
| 4,624,867 | A | 11/1986 | Iijima et al. |
| 4,690,728 | A | 9/1987 | Tsang et al. |
| 4,695,618 | A | 9/1987 | Mowrer |
| 4,710,426 | A | 12/1987 | Stephens |
| 4,722,515 | A | 2/1988 | Ham |
| 4,768,666 | A | 9/1988 | Kessler |
| 4,842,893 | A | 6/1989 | Yializis et al. |
| 4,843,036 | A | 6/1989 | Schmidt et al. |
| 4,855,186 | A | 8/1989 | Grolig et al. |
| 4,889,609 | A | 12/1989 | Cannella |
| 4,913,090 | A | 4/1990 | Harada et al. |
| 4,931,158 | A | 6/1990 | Bunshah et al. |
| 4,934,315 | A | 6/1990 | Linnebach et al. |
| 4,954,371 | A | 9/1990 | Yializis |
| 4,977,013 | A | 12/1990 | Ritchie et al. |
| 5,032,461 | A * | 7/1991 | Shaw et al. .................... 428/461 |
| 5,036,249 | A | 7/1991 | Pike-Biegunski et al. |
| 5,047,131 | A | 9/1991 | Wolfe et al. |
| 5,059,861 | A | 10/1991 | Littman et al. |
| 5,124,204 | A | 6/1992 | Yamashita et al. |
| 5,189,405 | A | 2/1993 | Yamashita et al. |
| 5,203,898 | A | 4/1993 | Carpenter et al. |
| 5,204,314 | A | 4/1993 | Kirlin et al. |
| 5,237,439 | A | 8/1993 | Misono et al. |
| 5,260,095 | A | 11/1993 | Affinito |
| 5,336,324 | A | 8/1994 | Stall et al. |
| 5,354,497 | A | 10/1994 | Fukuchi et al. |
| 5,356,947 | A | 10/1994 | Ali et al. |
| 5,357,063 | A | 10/1994 | House et al. |
| 5,376,467 | A | 12/1994 | Abe et al. |
| 5,393,607 | A | 2/1995 | Kawasaki et al. |
| 5,395,644 | A | 3/1995 | Affinito |
| 5,402,314 | A | 3/1995 | Amago et al. |
| 5,427,638 | A | 6/1995 | Goetz et al. |
| 5,440,446 | A | 8/1995 | Shaw et al. |
| 5,451,449 | A | 9/1995 | Shetty et al. |
| 5,461,545 | A | 10/1995 | Leroy et al. |
| 5,464,667 | A | 11/1995 | Kohler et al. |
| 5,510,173 | A | 4/1996 | Pass et al. |
| 5,512,320 | A | 4/1996 | Turner et al. |
| 5,536,323 | A | 7/1996 | Kirlin et al. |
| 5,547,508 | A | 8/1996 | Affinito |
| 5,554,220 | A | 9/1996 | Forrest et al. |
| 5,576,101 | A | 11/1996 | Saitoh et al. |
| 5,607,789 | A | 3/1997 | Treger et al. |
| 5,620,524 | A | 4/1997 | Fan et al. |
| 5,629,389 | A | 5/1997 | Roitman et al. |
| 5,652,192 | A | 7/1997 | Matson et al. |
| 5,654,084 | A | 8/1997 | Egert |
| 5,660,961 | A | 8/1997 | Yu |
| 5,665,280 | A | 9/1997 | Tropsha |
| 5,681,615 | A | 10/1997 | Affinito et al. |
| 5,681,666 | A | 10/1997 | Treger et al. |
| 5,684,084 | A | 11/1997 | Lewin et al. |
| 5,686,360 | A | 11/1997 | Harvey, III et al. |
| 5,693,956 | A | 12/1997 | Shi et al. |
| 5,695,564 | A | 12/1997 | Imahashi |
| 5,711,816 | A | 1/1998 | Kirlin et al. |
| 5,725,909 | A | 3/1998 | Shaw et al. |
| 5,731,661 | A | 3/1998 | So et al. |
| 5,736,207 | A | 4/1998 | Walther et al. |
| 5,747,182 | A | 5/1998 | Friend et al. |
| 5,757,126 | A | 5/1998 | Harvey, III et al. |
| 5,759,329 | A | 6/1998 | Krause et al. |
| 5,771,177 | A | 6/1998 | Tada et al. |
| 5,771,562 | A | 6/1998 | Harvey, III et al. |
| 5,782,355 | A | 7/1998 | Katagiri et al. |
| 5,792,550 | A | 8/1998 | Phillips et al. |
| 5,795,399 | A | 8/1998 | Hasegawa et al. |
| 5,811,177 | A | 9/1998 | Shi et al. |
| 5,811,183 | A | 9/1998 | Shaw et al. |
| 5,821,692 | A | 10/1998 | Rogers et al. |
| 5,844,363 | A | 12/1998 | Gu et al. |
| 5,861,658 | A | 1/1999 | Cronin et al. |
| 5,869,791 | A | 2/1999 | Young |
| 5,872,355 | A | 2/1999 | Hueschen |
| 5,891,554 | A | 4/1999 | Hosokawa et al. |
| 5,895,228 | A | 4/1999 | Biebuyck et al. |
| 5,902,641 | A | 5/1999 | Affinito et al. |
| 5,902,688 | A | 5/1999 | Antoniadis et al. |
| 5,904,958 | A | 5/1999 | Dick et al. |
| 5,912,069 | A | 6/1999 | Yializis et al. |
| 5,919,328 | A | 7/1999 | Tropsha et al. |
| 5,920,080 | A | 7/1999 | Jones |
| 5,922,161 | A | 7/1999 | Wu et al. |
| 5,929,562 | A | 7/1999 | Pichler |
| 5,934,856 | A | 8/1999 | Asakawa et al. |
| 5,945,174 | A | 8/1999 | Shaw et al. |
| 5,948,552 | A | 9/1999 | Antoniadis et al. |
| 5,952,778 | A | 9/1999 | Haskal et al. |
| 5,955,161 | A | 9/1999 | Tropsha |
| 5,965,907 | A | 10/1999 | Huang et al. |
| 5,968,620 | A | 10/1999 | Harvey et al. |
| 5,994,174 | A | 11/1999 | Carey et al. |
| 5,996,498 | A | 12/1999 | Lewis |
| 6,004,660 | A | 12/1999 | Topolski et al. |
| 6,013,337 | A | 1/2000 | Knors |
| 6,040,017 | A | 3/2000 | Mikhael et al. |
| 6,045,864 | A | 4/2000 | Lyons et al. |
| 6,066,826 | A | 5/2000 | Yializis |
| 6,083,313 | A | 7/2000 | Venkatraman et al. |
| 6,083,628 | A | 7/2000 | Yializis |
| 6,084,702 | A | 7/2000 | Byker et al. |
| 6,087,007 | A | 7/2000 | Fujii et al. |
| 6,092,269 | A | 7/2000 | Yializis et al. |
| 6,106,627 | A | 8/2000 | Yializis et al. |
| 6,117,266 | A | 9/2000 | Horzel et al. |
| 6,118,218 | A | 9/2000 | Yializis et al. |
| 6,146,225 | A | 11/2000 | Sheats et al. |
| 6,146,462 | A | 11/2000 | Yializis et al. |
| 6,150,187 | A | 11/2000 | Zyung et al. |
| 6,165,566 | A | 12/2000 | Tropsha |
| 6,178,082 | B1 | 1/2001 | Farooq et al. |
| 6,195,142 | B1 | 2/2001 | Gyotoku et al. |
| 6,198,217 | B1 | 3/2001 | Suzuki et al. |
| 6,198,220 | B1 | 3/2001 | Jones et al. |
| 6,203,898 | B1 | 3/2001 | Kohler et al. |
| 6,207,238 | B1 | 3/2001 | Affinito |
| 6,207,239 | B1 | 3/2001 | Affinito |
| 6,214,422 | B1 | 4/2001 | Yializis |
| 6,217,947 | B1 | 4/2001 | Affinito |
| 6,224,948 | B1 | 5/2001 | Affinito |
| 6,228,434 | B1 | 5/2001 | Affinito |
| 6,228,436 | B1 | 5/2001 | Affinito |
| 6,231,939 | B1 | 5/2001 | Shaw et al. |
| 6,264,747 | B1 | 7/2001 | Shaw et al. |
| 6,268,695 | B1 | 7/2001 | Affinito |
| 6,274,204 | B1 | 8/2001 | Affinito |
| 6,322,860 | B1 | 11/2001 | Stein et al. |
| 6,333,065 | B1 | 12/2001 | Arai et al. |
| 6,348,237 | B2 | 2/2002 | Kohler et al. |
| 6,349,887 | B1 * | 2/2002 | Pyo .............................. 239/137 |

(56) References Cited

U.S. PATENT DOCUMENTS

| | | | |
|---|---|---|---|
| 6,350,034 B1 | 2/2002 | Fleming et al. | |
| 6,352,777 B1 | 3/2002 | Bulovic et al. | |
| 6,358,570 B1 | 3/2002 | Affinito | |
| 6,361,885 B1 | 3/2002 | Chou | |
| 6,397,776 B1 | 6/2002 | Yang et al. | |
| 6,413,645 B1 | 7/2002 | Graff et al. | |
| 6,416,872 B1 | 7/2002 | Maschwitz | |
| 6,420,003 B2 | 7/2002 | Shaw et al. | |
| 6,436,544 B1 | 8/2002 | Veyrat et al. | |
| 6,460,369 B2 | 10/2002 | Hosokawa | |
| 6,465,953 B1 | 10/2002 | Duggal | |
| 6,468,595 B1 | 10/2002 | Mikhael et al. | |
| 6,469,437 B1 | 10/2002 | Parthasarathy et al. | |
| 6,469,438 B2 | 10/2002 | Fukuoka et al. | |
| 6,492,026 B1 | 12/2002 | Graff et al. | |
| 6,497,598 B2 | 12/2002 | Affinito | |
| 6,497,924 B2 | 12/2002 | Affinito et al. | |
| 6,509,065 B2 | 1/2003 | Affinito | |
| 6,512,561 B1 | 1/2003 | Terashita et al. | |
| 6,522,067 B1 | 2/2003 | Graff et al. | |
| 6,537,688 B2 | 3/2003 | Silvernail et al. | |
| 6,544,600 B2 | 4/2003 | Affinito et al. | |
| 6,569,515 B2 | 5/2003 | Hebrink et al. | |
| 6,570,325 B2 | 5/2003 | Graff et al. | |
| 6,573,652 B1 | 6/2003 | Graff et al. | |
| 6,576,351 B2 | 6/2003 | Silvernail | |
| 6,592,969 B1 | 7/2003 | Burroughes et al. | |
| 6,597,111 B2 | 7/2003 | Silvernail et al. | |
| 6,613,395 B2 | 9/2003 | Affinito et al. | |
| 6,614,057 B2 | 9/2003 | Silvernail et al. | |
| 6,624,568 B2 | 9/2003 | Silvernail | |
| 6,627,267 B2 | 9/2003 | Affinito | |
| 6,628,071 B1 | 9/2003 | Su | |
| 6,653,780 B2 | 11/2003 | Sugimoto et al. | |
| 6,656,537 B2 * | 12/2003 | Affinito et al. | 427/488 |
| 6,664,137 B2 | 12/2003 | Weaver | |
| 6,681,716 B2 | 1/2004 | Schaepkens | |
| 6,710,542 B2 | 3/2004 | Chun et al. | |
| 6,734,625 B2 | 5/2004 | Vong et al. | |
| 6,737,753 B2 | 5/2004 | Kumar et al. | |
| 6,743,524 B2 | 6/2004 | Schaepkens | |
| 6,749,940 B1 | 6/2004 | Terasaki et al. | |
| 6,765,351 B2 | 7/2004 | Forrest et al. | |
| 6,803,245 B2 | 10/2004 | Auch et al. | |
| 6,811,829 B2 | 11/2004 | Affinito et al. | |
| 6,815,887 B2 | 11/2004 | Lee et al. | |
| 6,818,291 B2 | 11/2004 | Funkenbusch et al. | |
| 6,822,391 B2 | 11/2004 | Yamazaki et al. | |
| 6,827,788 B2 | 12/2004 | Takahashi | |
| 6,835,950 B2 | 12/2004 | Brown et al. | |
| 6,836,070 B2 | 12/2004 | Chung et al. | |
| 6,837,950 B1 | 1/2005 | Berard | |
| 6,852,356 B2 | 2/2005 | Nishikawa | |
| 6,864,629 B2 | 3/2005 | Miyaguchi et al. | |
| 6,866,901 B2 | 3/2005 | Burrows et al. | |
| 6,867,539 B1 | 3/2005 | McCormick et al. | |
| 6,872,114 B2 | 3/2005 | Chung et al. | |
| 6,872,248 B2 | 3/2005 | Mizutani et al. | |
| 6,872,428 B2 | 3/2005 | Yang et al. | |
| 6,878,467 B2 | 4/2005 | Chung et al. | |
| 6,888,305 B2 | 5/2005 | Weaver | |
| 6,888,307 B2 | 5/2005 | Silvernail et al. | |
| 6,891,330 B2 | 5/2005 | Duggal et al. | |
| 6,897,474 B2 | 5/2005 | Brown et al. | |
| 6,897,607 B2 | 5/2005 | Sugimoto et al. | |
| 6,905,769 B2 | 6/2005 | Komada | |
| 6,909,230 B2 | 6/2005 | Affinito et al. | |
| 6,911,667 B2 | 6/2005 | Pichler | |
| 6,936,131 B2 | 8/2005 | McCormick et al. | |
| 6,975,067 B2 | 12/2005 | McCormick et al. | |
| 6,998,648 B2 | 2/2006 | Silvernail | |
| 7,002,294 B2 | 2/2006 | Forrest et al. | |
| 7,012,363 B2 | 3/2006 | Weaver et al. | |
| 7,015,640 B2 | 3/2006 | Schaepkens et al. | |
| 7,018,713 B2 | 3/2006 | Padiyath et al. | |
| 7,029,765 B2 | 4/2006 | Kwong et al. | |
| 7,074,501 B2 | 7/2006 | Czeremuszkin et al. | |
| 7,112,351 B2 | 9/2006 | Affinito | |
| 7,166,007 B2 | 1/2007 | Auch et al. | |
| 7,198,832 B2 | 4/2007 | Burrows et al. | |
| 7,221,093 B2 | 5/2007 | Auch et al. | |
| 7,255,823 B1 | 8/2007 | Guenther et al. | |
| 7,298,072 B2 | 11/2007 | Czeremuszkin et al. | |
| 7,621,794 B2 | 11/2009 | Lee et al. | |
| 7,883,076 B2 * | 2/2011 | Okabe et al. | 261/142 |
| 2001/0015074 A1 | 8/2001 | Hosokawa | |
| 2001/0015620 A1 | 8/2001 | Affinito | |
| 2002/0022156 A1 | 2/2002 | Bright | |
| 2002/0025444 A1 | 2/2002 | Hebgrink et al. | |
| 2002/0068143 A1 | 6/2002 | Silvernail | |
| 2002/0069826 A1 | 6/2002 | Hunt et al. | |
| 2002/0102363 A1 | 8/2002 | Affinito et al. | |
| 2002/0102818 A1 | 8/2002 | Sandhu et al. | |
| 2002/0125822 A1 | 9/2002 | Graff et al. | |
| 2002/0139303 A1 | 10/2002 | Yamazaki et al. | |
| 2002/0140347 A1 | 10/2002 | Weaver | |
| 2003/0038590 A1 | 2/2003 | Silvernail et al. | |
| 2003/0085652 A1 | 5/2003 | Weaver | |
| 2003/0098647 A1 | 5/2003 | Silvernail et al. | |
| 2003/0124392 A1 | 7/2003 | Bright | |
| 2003/0127973 A1 | 7/2003 | Weaver et al. | |
| 2003/0184222 A1 | 10/2003 | Nilsson et al. | |
| 2003/0197197 A1 | 10/2003 | Brown et al. | |
| 2003/0218422 A1 | 11/2003 | Park et al. | |
| 2003/0235648 A1 | 12/2003 | Affinito et al. | |
| 2004/0018305 A1 | 1/2004 | Pagano et al. | |
| 2004/0029334 A1 | 2/2004 | Bijker et al. | |
| 2004/0046497 A1 | 3/2004 | Schaepkens et al. | |
| 2004/0071971 A1 | 4/2004 | Iacovangelo | |
| 2004/0113542 A1 | 6/2004 | Hsiao et al. | |
| 2004/0115402 A1 | 6/2004 | Schaepkens | |
| 2004/0115859 A1 | 6/2004 | Murayama et al. | |
| 2004/0119028 A1 | 6/2004 | McCormick et al. | |
| 2004/0175512 A1 | 9/2004 | Schaepkens | |
| 2004/0175580 A1 | 9/2004 | Schaepkens | |
| 2004/0187999 A1 | 9/2004 | Wilkinson et al. | |
| 2004/0209090 A1 | 10/2004 | Iwanaga | |
| 2004/0212759 A1 | 10/2004 | Hayashi | |
| 2004/0219380 A1 | 11/2004 | Naruse et al. | |
| 2004/0229051 A1 | 11/2004 | Schaepkens et al. | |
| 2004/0241454 A1 | 12/2004 | Shaw et al. | |
| 2004/0263038 A1 | 12/2004 | Ribolzi et al. | |
| 2005/0003098 A1 | 1/2005 | Kohler et al. | |
| 2005/0006786 A1 | 1/2005 | Sawada | |
| 2005/0051094 A1 | 3/2005 | Schaepkens et al. | |
| 2005/0079295 A1 | 4/2005 | Schaepkens | |
| 2005/0079380 A1 | 4/2005 | Iwanaga | |
| 2005/0093001 A1 | 5/2005 | Liu et al. | |
| 2005/0093437 A1 | 5/2005 | Ouyang | |
| 2005/0094394 A1 | 5/2005 | Padiyath et al. | |
| 2005/0095422 A1 | 5/2005 | Sager et al. | |
| 2005/0095736 A1 | 5/2005 | Padiyath et al. | |
| 2005/0112378 A1 | 5/2005 | Naruse et al. | |
| 2005/0122039 A1 | 6/2005 | Satani | |
| 2005/0129841 A1 | 6/2005 | McCormick et al. | |
| 2005/0133781 A1 | 6/2005 | Yan et al. | |
| 2005/0140291 A1 | 6/2005 | Hirakata et al. | |
| 2005/0146267 A1 | 7/2005 | Lee et al. | |
| 2005/0174045 A1 | 8/2005 | Lee et al. | |
| 2005/0176181 A1 | 8/2005 | Burrows et al. | |
| 2005/0212419 A1 | 9/2005 | Vazan et al. | |
| 2005/0224935 A1 | 10/2005 | Schaepkens et al. | |
| 2005/0238846 A1 | 10/2005 | Arakatsu et al. | |
| 2005/0239294 A1 | 10/2005 | Rosenblum et al. | |
| 2006/0003474 A1 | 1/2006 | Tyan et al. | |
| 2006/0028128 A1 | 2/2006 | Ohkubo | |
| 2006/0061272 A1 | 3/2006 | McCormick et al. | |
| 2006/0062937 A1 | 3/2006 | Padiyath et al. | |
| 2006/0063015 A1 | 3/2006 | McCormick et al. | |
| 2006/0078691 A1 * | 4/2006 | Cherif et al. | 427/600 |
| 2006/0216951 A1 | 9/2006 | Moro et al. | |
| 2006/0246811 A1 | 11/2006 | Winters et al. | |
| 2006/0250084 A1 | 11/2006 | Cok et al. | |
| 2007/0009674 A1 | 1/2007 | Okubo et al. | |

(56) References Cited

U.S. PATENT DOCUMENTS

| | | |
|---|---|---|
| 2007/0033965 A1 | 2/2007 | Lifson et al. |
| 2008/0032076 A1 | 2/2008 | Dujardin et al. |
| 2008/0268389 A1* | 10/2008 | Nordh .................. 431/215 |
| 2009/0258235 A1 | 10/2009 | Tateishi |

FOREIGN PATENT DOCUMENTS

| | | |
|---|---|---|
| DE | 196 03 746 A1 | 4/1997 |
| DE | 696 15 510 T2 | 6/1997 |
| DE | 10 2004 063 619 A1 | 7/2006 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 8/1997 |
| EP | 0 787 826 A1 | 8/1997 |
| EP | 0 915 105 A1 | 5/1999 |
| EP | 0 916 394 A2 | 5/1999 |
| EP | 0 931 850 A1 | 7/1999 |
| EP | 0 977 469 A2 | 2/2000 |
| EP | 1 021 070 A1 | 7/2000 |
| EP | 1 127 381 | 8/2001 |
| EP | 1 130 420 A2 | 9/2001 |
| EP | 1 278 244 A2 | 1/2003 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| IE | 0 147 696 B1 | 7/1985 |
| JP | S63-96895 | 4/1988 |
| JP | 63136316 | 6/1988 |
| JP | 01041067 | 2/1989 |
| JP | S64-41192 | 2/1989 |
| JP | 02183230 | 7/1990 |
| JP | 3-183759 | 8/1991 |
| JP | 03290375 | 12/1991 |
| JP | 4-14440 | 1/1992 |
| JP | 4-48515 | 2/1992 |
| JP | 04267097 | 9/1992 |
| JP | 06158305 | 11/1992 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 6234186 A | 8/1994 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 8-318590 | 12/1996 |
| JP | 08325713 | 12/1996 |
| JP | 09059763 | 4/1997 |
| JP | 09132774 | 5/1997 |
| JP | 09161967 | 6/1997 |
| JP | 9-201897 | 8/1997 |
| JP | 10-725 | 1/1998 |
| JP | 10-013083 | 1/1998 |
| JP | 10312883 | 11/1998 |
| JP | 11040344 | 2/1999 |
| JP | 11-149826 | 6/1999 |
| JP | 11255923 | 9/1999 |
| JP | 2003282239 A | 10/2003 |
| JP | 2004-176111 A | 6/2004 |
| WO | WO 87/07848 | 12/1987 |
| WO | WO 89/00337 | 1/1989 |
| WO | 91/07519 A1 | 5/1991 |
| WO | WO 95/10117 | 4/1995 |
| WO | WO 96/23217 | 8/1996 |
| WO | WO 97/04885 | 2/1997 |
| WO | WO 97/16053 | 5/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | 99/33651 A1 | 7/1999 |
| WO | WO 99/46120 | 9/1999 |
| WO | WO 00/26973 | 5/2000 |
| WO | WO 00/35603 | 6/2000 |
| WO | WO 00/35604 | 6/2000 |
| WO | WO 00/35993 | 6/2000 |
| WO | WO 00/36661 | 6/2000 |
| WO | WO 00/36665 | 6/2000 |
| WO | WO 01/81649 A1 | 11/2001 |
| WO | WO 01/82336 A2 | 11/2001 |
| WO | WO 01/82389 A1 | 11/2001 |
| WO | WO 01/87825 A1 | 11/2001 |
| WO | WO 01/89006 A1 | 11/2001 |
| WO | WO 02/26973 A1 | 4/2002 |
| WO | 02/051626 A1 | 7/2002 |
| WO | 02071506 A1 | 9/2002 |
| WO | WO 03/016589 A1 | 2/2003 |
| WO | WO 03/098716 A1 | 11/2003 |
| WO | WO 2004/006199 A3 | 1/2004 |
| WO | WO 2004/016992 A1 | 2/2004 |
| WO | WO 2004/070840 A1 | 8/2004 |
| WO | WO 2004/089620 A2 | 10/2004 |
| WO | 2004112165 A | 12/2004 |
| WO | WO 2005/015655 A1 | 2/2005 |
| WO | WO 2005/045947 A2 | 5/2005 |
| WO | WO 2005/048368 A1 | 5/2005 |
| WO | WO 2006/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |

OTHER PUBLICATIONS

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In-situ and real-time monitoring of plasma-induced etching PET and acrylic films, Plasma and Polymers, Dec. 1999, 4(4), pp. 1-25.

Affinito, J.D. et al.; Vacuum Deposited Polymer/Metal Multilayer Films for Optical Applications; Paper No. C1.13; International Conference on Metallurgical Coating; Apr. 15-21, 1995; pp. 1-14.

Affinito, J.D. et al., "Vacuum Deposition of Polymer Electrolytes on Flexible Substrates" Proceedings of the Ninth International Conference on Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" 43$^{rd}$ Annual Technical Conference Proceedings, Denver, Apr. 15-20, 2000, pp. 404-407.

Henry, B.M. et al., "Microstructural and Gas Barrier Properties of Transparent Aluminum Oxide and Indium Tin Oxide Films" 43$^{rd}$ Annual Technical Conference Proceedings, Denver, Apr. 15-20, 2000, pp. 373-378.

Affinito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; 43$^{rd}$ Annual Technical Conference Proceedings; Denver, Apr. 15-20, 2000; pp. 347-351.

Mahon, J.K. et al.; Requirements of Flexible Substrates for Organic Light Emitting Devices in Flat Panel Display Applications; Society of Vacuum Coaters; 42$^{nd}$ Annual Technical Conference Proceedings; Apr. 1999; pp. 456-459.

(56) References Cited

OTHER PUBLICATIONS

Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.
Tropsha et al.; Combinatorial Barrier Effect of the Multilayer SiOx Coatings on Polymer Substrates; Society of Vacuum Coaters; 40th Annual Technical Conferences Proceedings; Apr. 12-17, 1997; pp. 64-69.
Affinito, J.D, et al.; Ultra High Rate, Wide Area, Plasma Polymerized Films from High Molecular Weight/Low Vapor Pressure Liquid or Solid Monomer Precursors; 45th International Symposium of the American Vacuum Society; Nov. 2-6, 1998; pp. 0-26.
Felts, J.T.; Transparent Barrier Coatings Update: Flexible Substrates; 36th Annual Technical Conference Proceedings; Apr. 25-30, 1993 pp. 324-331.
Affinito, J.D. et al.; Molecularly Doped Polymer Composite Films for Light Emitting Polymer Application Fabricated by the PML Process, 41st Technical Conference of the Society of Vacuum Coaters; Apr. 1998; pp. 220-225.
Affinito, J.D. et al.; Vacuum Deposited Conductive Polymer Films; The Eleventh International Conference on Vacuum Web Coating; Nov. 9-11, 1997; pp. 0-12.
Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.
Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.
Bright, Clark I.; Transparent Barrier Coatings Based on ITO for Flexible Plastic Displays; Thirteenth International Conference on Vacuum Web Coatings; Oct. 17-19, 1999; pp. 247-255.
Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.
Hibino, N. et al.; Transparent Barrier Al$_2$O$_3$ Coating by Activated Reactive Evaporation; Thirteenth International Conference on Vacuum Web Coatings; Oct. 17-19, 1999; pp. 234-245.
Shi, M.K. et al.; Plasma treatment of PET and acrylic coating surfaces-I. In situ XPS measurements; Journal of Adhesion Science and Technology; Mar. 2000, 14(12); pp. 1-28.
Affinito, J.D. et al.; "PML/Oxide/PML Barrier Layer Performance Differences Arising From Use of UV or Electron Beam Polymerization of the PML Layers;" SVC 40th Annual Technical Conference; Apr. 12-17, 1997; pp. 19-25.
Yializis, A. et al.; High Oxygen Barrier Polypropylene Films Using Transparent Acrylate-A$_2$0$_3$ and Opaque Al-Acrylate Coatings; 1995; pp. 95-102; Society of Vacuum Coaters.
Shaw, D.G. et at; Use of Vapor Deposited Acrylate Coatings to Improve the Barrier Properties of Metallized Film; 1994; pp. 240-244; Society of Vacuum Coaters.
Affinito, J.D. et al.; "Vacuum Deposited Conductive Polymer Films" The Eleventh International Conference on Vacuum Web Coating, no earlier than Feb. 1998, pp. 200-213.
Bunshah, R.F. et al.; "Deposition Technologies for Films and Coatings" Noyes Publications, Park Ridge, New Jersey, 1982, p. 339.
Affinito, J.D.; Energy Res. Abstr. 18(6), #17171, 1993.
Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.
Affinito, J.D. et al; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.
Graupner, W. et al.; "High Resolution Color Organic Light Emitting Diode Microdisplay Fabrication Method", SPIE Proceedings; Nov. 6, 2000; pp. 11-19.

Czeremuszkin, G. et al.; Permeation Through Defects in Transparent Barrier Coated Plastic Films; 43rd Annual Technical Conference Proceedings; Apr. 15, 2000; pp. 408-413.
Vossen, J.L. et al.; Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.
G. Gustafason, et al.; Flexible light-emitting diodes made from soluble conducting polymers; Letters to Nature; Vo. 357; Jun. 11, 1992; pp. 477-479.
F.M. Penning; Electrical Discharges in Gases; 1965; pp. 1-51; Gordon and Breach, Science Publishers, New York-London-Paris.
Affinito, J.D., et al.; High Rate Vacuum Deposition of Polymer Electrolytes; Journal Vacuum Science Technology A 14(3), May/Jun. 1996.
Phillips, R.W.; Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.
Yamada Y. et al.; The Properties of a New Transparent and Colorless Barrier Film; 1995; pp. 28-31; Society of Vacuum Coaters.
Chahroudi, D.; Transparent Glass Barrier Coatings for flexible Film Packaging; 1991; pp. 130-133; Society of Vacuum Coaters.
Krug, T. et al.; New Developments in Transparent Barrier Coatings; 1993; pp. 302-305; Society Vacuum Coaters.
Affinito, J.D. et al.; A new method for fabricating transparent barrier layers, Thin Solid Films 290291; 1996; pp. 63-67.
Affinito, J.D. et al.; Polymer-Oxide Transparent Barrier Layers; SVC 39th Annual Technical Conference; Vacuum Web Coating Session; 1996; pp. 392-397.
Hoffman, G. et al.; Transparent Barrier Coatings by Reactive Evaporation; 1994; pp. 155-160; Society of Vacuum Coaters.
Klemberg-Sapieha, J.E. et al.; Transparent Gas Barrier Coatings Produced by Dual-Frequency PECVD; 1993; pp. 445-449; Society of Vacuum Coaters.
Finson, E. et al.; Transparent SiO$_2$ Barrier Coatings: Conversion of Production Status; 1994; pp. 139-143; Society of Vacuum Coaters.
Affinito, J.D. et al; Ultra High Rate, Wide Area, Plasma Polymerized Films from High Molecular Weight/Low Vapor Pressure Liquid or Liquid/Solid Suspension Monomer Precursors; MRS Conference; Nov. 29, 1998-Dec, 3, 1998; Paper No. Y12.1.
Chwang et al, "Thin film encapsulated flexible organic electroluminescent displays" Applied Physics Letters, vol. 83, No. 3, Jul. 21, 2003, pp. 413-415.
Akedo et al, "Plasma-CVD SiNx/Plasma-Polymerized CNx:H Multi-layer Passivation Films for Organic Light Emitting Diodes" Society of Information Display Digest of Technical Papers, vol. 34, No. 1, May 1, 2003, pp. 559-561.
Office Action pertaining to U.S. Appl. No. 12/758,244 dated Jan. 20, 2011.
Office Action pertaining to U.S. Appl. No. 12/758,244 dated Jun. 7, 2011.
Office Action pertaining to U.S. Appl. No 12/341,251 dated Feb. 17, 2011.
International Search Report and Written Opinion pertaining to International application No. PCT/US2009/060437 dated Feb. 17, 2010.
International Search Report and Written Opinion pertaining to International application No. PCT/US2009/066518 dated Feb. 15, 2010.
Japanese Office Action pertaining to Japanese Patent Application No. 2003-586919 dated Dec. 16, 2009.
Chinese Office Action pertaining to Chinese Patent Application No. 200580049572.8 dated Jan. 8, 2010.
Notice of Allowance pertaining to U.S. Appl. No. 11/693,022 dated Jan. 28, 2010.
Notice of Allowance dated Dec. 29, 2009 pertaining to U.S. Appl. No. 11/693,022.
Advisory Action dated Dec. 15, 2009 pertaining to U.S. Appl. No. 11/693,020.
Election/Restrictions Requirement dated Dec. 14, 2009 pertaining to U.S. Appl. No. 11/509,837.
Examiner's Answer dated Nov. 12, 2009 pertaining to U.S. Appl. No. 10/412,133.

(56) References Cited

OTHER PUBLICATIONS

Office Action dated Dec. 7, 2009 pertaining to U.S. Appl. No. 11/068,356.
Office Action dated Dec. 1, 2009 pertaining to U.S. Appl. No. 11/627,583.
Office Action of U.S. Appl. No. 11/693,020 dated Oct. 29, 2009.
Advisory Action of U.S. Appl. No. 10/412,133 dated Apr. 8, 2008.
Advisory Action of U.S. Appl. No. 10/412,133 dated Aug. 8, 2008.
Advisory Action of U.S. Appl. No. 11/112,880 dated Jul. 23, 2009.
Advisory Action of U.S. Appl. No. 11/693,022 dated Oct. 21, 2009.
Election/Restrictions Requirement of U.S. Appl. No. 10/412,133 dated Dec. 28, 2004.
Election/Restrictions Requirement of U.S. Appl. No. 11/112,880 dated Jul. 25, 2008.
Election/Restrictions Requirement of U.S. Appl. No. 11/693,020 dated Aug. 8, 2008.
Election/Restrictions Requirement of U.S. Appl. No. 11/693,022 dated Oct. 7, 2008.
Advisory Action of U.S. Appl. No. 11/068,356 dated Feb. 12, 2008.
Election/Restrictions Requirement of U.S. Appl. No. 11/693,020 dated Jun. 25, 2009.
Election/Restrictions Requirement of U.S. Appl. No. 11/509,837 dated Mar. 4, 2009.
Notice of Allowance of U.S. Appl. No. 11/776,616 dated Sep. 18, 2009.
Office Action of U.S. Appl. No. 11/693,022 dated Jan. 23, 2009.
Office Action of U.S. Appl. No. 10/412,133 dated Mar. 3, 2006.
Office Action of U.S. Appl. No. 10/412,133 dated Mar. 28, 2005.
Office Action of U.S. Appl. No. 11/112,880 dated May 28, 2009.
Advisory Action of U.S. Appl. No. 11/068,356 dated Mar. 30, 2009.
Office Action of U.S. Appl. No. 11/693,022 dated Aug. 18, 2009.
Office Action of U.S. Appl. No. 10/412,133 dated Sep. 5, 2007.
Office Action of U.S. Appl. No. 10/412,133 dated Sep. 7, 2006.
Office Action of U.S. Appl. No. 11/776,616 dated Sep. 26, 2008.
Office Action of U.S. Appl. No. 10/412,133 dated Nov. 3, 2005.
Office Action of U.S. Appl. No. 11/112,880 dated Dec. 3, 2008.
Office Action of U.S. Appl. No. 10/412,133 dated Dec. 11, 2007.
Office Action of U.S. Appl. No. 11/693,020 dated Dec. 30, 2008.
Election/Restrictions Requirement of U.S. Appl. No. 11/068,356 dated Oct. 17, 2008.
Office Action of U.S. Appl. No. 11/068,356 dated Jan. 22, 2009.
Office Action of U.S. Appl. No. 11/068,356 dated Apr. 4, 2008.
Office Action of U.S. Appl. No. 11/068,356 dated Jun. 10, 2009.
Office Action of U.S. Appl. No. 11/068,356 dated Jun. 15, 2007.
Office Action of U.S. Appl. No. 11/068,356 dated Nov. 28, 2007.
Office Action of U.S. Appl. No. 11/509,837 dated Jun. 30, 2009.
Election/Restrictions Requirement of U.S. Appl. No. 12/345,912 dated Oct. 27, 2009.
Young-Gu Lee et al., Thin Film Encapsulation of AMOLED Displays with Polyurea/Al2O3 Hybrid Multi-Layers, Reformable Display Group, Samsung Electronics, Paper, pp. 1457-1459 (IDW 2008).
Office Action dated Aug. 12, 2010 pertains to U.S. Appl. No. 12/758,244.

* cited by examiner

EVAPORATOR WITH INTERNAL RESTRICTION

CROSS-REFERENCE TO RELATED APPLICATIONS

This application is a continuation of co-pending (and now allowed) U.S. patent application Ser. No. 12/650,586, filed Dec. 31, 2009 and entitled "EVAPORATOR WITH INTERNAL RESTRICTION".

The invention relates generally to evaporators for flash evaporation, and more particularly to an evaporator having improved evaporator pressure stability and film uniformity.

BACKGROUND OF THE INVENTION

Flash evaporation of a liquid (single or multi-component) uses an ultrasonic nozzle to atomize the liquid into small droplets which are then dispersed in a container maintained at elevated temperature (evaporator). When the droplets contact the walls of the evaporator, they instantaneously transform to the vapor state without boiling. This process eliminates the separation or distillation of the individual components of the liquid and maintains the equivalent composition of the liquid in the vapor phase. The flash evaporation process is generally described, for example, in U.S. Pat. Nos. 4,954,371, and 4,842,893, which are incorporated herein by reference.

One problem with this process is that the atomization process is not perfectly constant, which results in fluctuations of the amount of liquid transformed into the vapor phase over time. In one application of the flash evaporation process, the vapor phase is transported to a nozzle where the vapor is directed towards a substrate that passes by the nozzle and onto which the vapor condenses to form a thin liquid layer. Fluctuations in the amount of vapor (as measured by the pressure in the evaporator) result in variation of the flux reaching the substrate, causing an undesirable variation in the thickness of the condensed liquid layer.

One solution to this problem was the introduction of baffles in the evaporator in an attempt to homogenize the vapor pressure before it exits through the nozzle. The use of baffles is described, for example, in U.S. Pat. No. 5,902,641, which is incorporated herein by reference. However, the use of internal baffles has been only partially successful in reducing the vapor fluctuation. Moreover, this method adds complexity and expense to the evaporator fabrication.

In addition, in order for a uniform liquid film to be formed on the substrate, the pressure in the evaporator should reach a steady-state condition in as short a time as possible. This reduces the overall time for the discrete coating process and increases process throughput for manufacture. One method that has been used to reduce the time needed to reach a steady state condition is to narrow the opening of the vapor nozzle through which the vapor exits to the substrate. Although this does reduce the time for the evaporator to reach a steady-state pressure, the machining tolerances of the vapor nozzle become more difficult to achieve, making it more expensive and difficult to fabricate components.

Therefore, there is a need for an evaporator having reduced variation in the amount of vapor reaching the substrate. There is also a need for a less costly evaporator which reaches steady state quickly.

SUMMARY OF THE INVENTION

The present invention meets this need by providing an improved evaporator. The evaporator includes a vaporization chamber having a monomer inlet and a vapor outlet. There is a vapor nozzle in the vapor outlet. The evaporator also includes a collar positioned between the vaporization chamber and the vapor nozzle. The pressure in the evaporator is increased and the conductance through the nozzle is substantially unchanged. This reduces the impact of any variation in the atomization process.

DETAILED DESCRIPTION OF THE INVENTION

The conductance through the nozzle is an important characteristic in reducing the variation in the amount of vapor reaching the substrate. Conductance is the amount of vapor that can pass through an opening for a given pressure differential. The easiest way to change the conductance is to vary the diameter of the opening. Alternatively, methods using tubes or closely spaced parallel plates can also be used.

In one embodiment, there is a collar located between the evaporation chamber and the vapor nozzle through which the vapor exits onto the substrate. The collar forms a constriction, such as a small aperture, which is designed to match the equivalent restriction that had previously been obtained by narrowing the vapor nozzle exit. The result is that the evaporator pressure is increased while the vapor nozzle exit width remains unchanged. This improves the stability of the evaporator pressure with regard to variations in the atomization process because there is much more vapor contained in the evaporator. Consequently, any fluctuation in the atomization process represents a much smaller fraction of the total vapor. At the same time, the vapor pressure at the vapor nozzle is essentially unchanged because the amount of vapor flowing is the same, and the conductance through the slit of the nozzle is unchanged. The result is that the deposition process (average rate of liquid accumulation on the substrate) is unchanged, and a much more consistent and uniform thin film is deposited. Thus, the collar provides a low cost solution to the problems found in prior art processes.

An additional feature that results from the present invention is that the stabilization of the evaporator pressure allows for the use of feedback to vary the pressure controllably allowing for changes in film thickness in controlled manner. Previously, the fluctuations occurred with a short time period making feedback difficult because of the slow response time of the fluid flow control system. In one implementation of the fluid flow control system, the flow rate is controlled by the rate of displacement of a piston pump containing the fluid. The pump is connected to the atomization nozzle on the evaporator by a length of tubing. The lag time (delay) of the flow rate to changes in the displacement rate of the pump is similar to the frequency of the fluctuations of the pressure in the evaporator. This makes it difficult to provide a stable feedback system that reduces the pressure fluctuations.

Figure 1:
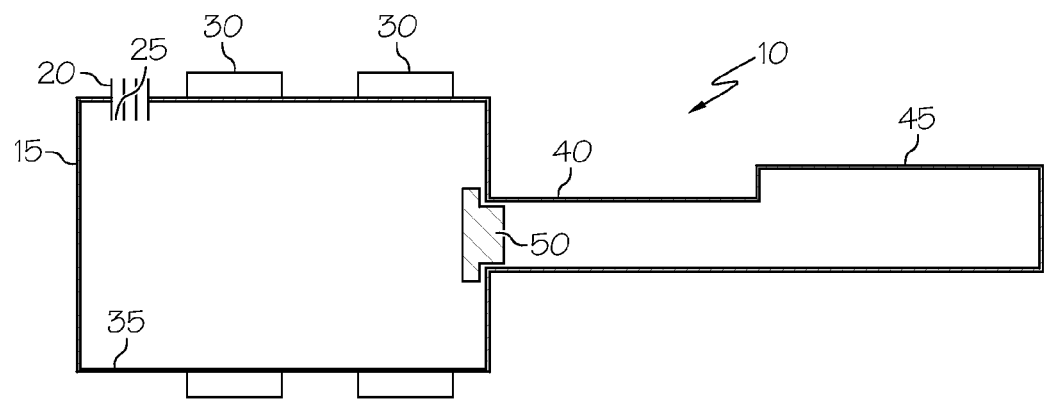
FIG. 1 is a cross-section showing one embodiment of an evaporator.
Figure 2:
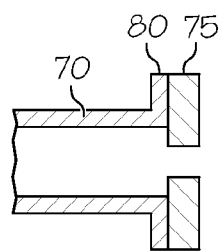
FIG. 2 is a cross-section of one embodiment of a collar.
Figure 3:
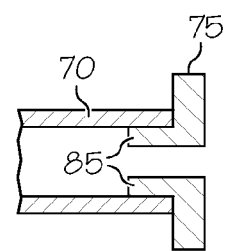
FIG. 3 is a cross-section of another embodiment of a collar.
Figure 4:
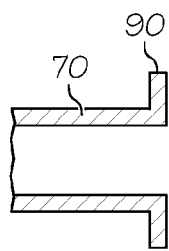
FIG. 4 is a cross-section of another embodiment of a collar.
Figure 5:
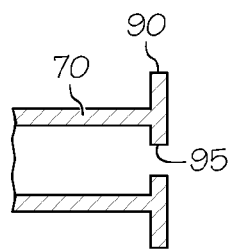
FIG. 5 is a cross-section of another embodiment of a collar.
Figure 6:
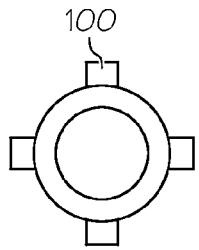
FIG. 6 is a cross-section of another embodiment of a collar.

An evaporator 10 is shown in FIG. 1. There is a vaporization chamber 15 with a fluid inlet 20. This can be applied to various types of fluid systems, including, but not limited to, monomers, oligomers, resins, and the like, as would be understood by those of skill in the art. There is an atomizer 25.

There are heaters 30 to heat the surface 35 of the vaporization chamber 15. Monomer flow through the atomizer 25 is atomized into particles or droplets which strike the heated surface 35 whereupon the particles or droplets are flash evaporated into a gas, evaporate, or composite vapor. The gas flows through the vapor outlet 40 and out of the vapor nozzle 45 to the surface being coated where it condenses.

The cross-sectional area of the vapor outlet is less than the cross-sectional area of the vaporization chamber, and the vapor nozzle has a cross-sectional area less than the cross-sectional area of the vapor outlet.

There is a collar 50 between the vaporization chamber 15 and the vapor nozzle 45. The collar has a cross-sectional area less than the cross-sectional area of the vapor nozzle. The removable collar can be easily inserted into and removed from the vapor outlet. Thus, the amount of vapor which flows out the vaporization chamber is reduced without having to reduce the size of the vapor nozzle.

The collar can be removable, i.e., not permanently attached to the evaporator or the vapor outlet, if desired. For example, it can be inserted in and removed from the vapor outlet. Typically, the collar will simply slide into the vapor outlet and be held by friction. However, other arrangements are possible. Alternatively, the collar can be permanently attached if the size of the aperture does not need to be changed.

Currently, one of the formulation criteria for monomer blends is the evaporation rate and deposition rate using an existing evaporator configuration. The use of the removable collar allows the evaporator configuration to be changed simply by changing the removable collar. This expands the range of blends which can be used to include blends which do not deposit well using the existing configuration. If a particular blend of monomer had less consistent atomization, perhaps as a result of higher viscosity, the hole size of the collar could be reduced to increase the pressure (amount of vapor) in the evaporator to average the fluctuations in atomization over a greater time.

Various embodiments of the removable collar are shown in FIGS. 2-6. As shown in FIG. 2, the collar has a first portion 70 which is inserted into the vapor outlet and a second portion 75. The first portion 70 has a outwardly extending portion 80 which prevents further insertion into the vapor outlet. The outwardly extending portion can be used to grip the collar when it is to be removed. In addition, the second portion of the collar can be connected to the outwardly extending portion, if desired. In this embodiment, the outwardly extending portion is a flange. Alternatively, one or more tabs could be used instead of a flange.

The second portion 75 of the collar has a cross-sectional area less than the cross-sectional area of the vapor outlet. There can be a series of second portions having different sized openings which can be used with the same first portion, for example.

The first portion of the collar can be an annular ring with an annular flange. The second portion can be a second annular flange with a smaller cross-sectional area than the vapor outlet.

The first and second portions can be connected permanently, or they can be removably connected. A removable connection allows the same first portion to be used with more than one second portion. Removable connections include, but are not limited to, screws, threaded helical surfaces, lugs and grooves, tapered connections, bayonet connections, and snap connections. Permanent connections include, but are not limited to, welding. With a permanent connection, the entire collar would be changed, rather than just the second portion.

FIG. 3 shows another embodiment of the collar. The second portion 75 includes a portion 85 which can be inserted into the first portion 70 of the collar. The first and second portions 70, 75 can be held together using a friction fit, or other method as desired. This arrangement allows the cross-sectional area of the collar to be changed by inserting different sized second portions having different cross-sectional areas (e.g., having different wall thicknesses). In this case, the first and second portions are removably connected, as discussed above. There is no flange in this embodiment as shown. However, a flange could be included if desired.

FIG. 4 shows an embodiment of the collar in which there is no second portion. The first portion 70 can be inserted in the vapor outlet. There is an outwardly extending portion 90 which prevents further insertion into the vapor outlet. Suitable outwardly extending portions include, but are not limited to, flanges, and one or more tabs. In this embodiment, the first portion has thicker walls which reduce the cross-sectional area of the collar. In this case, multiple collars would be needed, each with a different cross-sectional area.

In FIG. 5, the outwardly extending portion 90 also has an inwardly extending portion 95, which reduces the cross-sectional area. The outwardly and inwardly extending portions 90, 95 can be a flange, if desired. For example, the collar can be an annular ring with an annular flange extending outward from the ring and inward from the ring.

FIG. 6 shows a collar with tabs 100 to prevent further insertion. There is at least one tab, and there can be at least two tabs, or at least three tabs, or at least four tabs, or more. The tabs can be smaller when there are more of them, if desired. Multiple tabs help to prevent the collar from tilting and jamming when being inserted or removed.

The collar can be any desired shape, including, but not limited to cylindrical, square, rectangular, triangular, or other polygonal shape. It will generally be the same shape as the vapor outlet, although it could be a different shape, if desired. The collar will typically be cylindrical.

The collar can be a unitary piece or it can be two or more pieces. If the collar is in two (or more) pieces (e.g., as shown in FIGS. 2-3), then there can be multiple second portions having different cross-sectional areas. If the collar is a unitary piece (e.g., as shown in FIGS. 4-5), then multiple collars will be needed to provide a range of cross-sectional areas.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of flash evaporating a liquid, the method comprising:

introducing the liquid into an inlet of a vaporization chamber;

passing the liquid through an atomizer that is configured to ultrasonically vaporize the introduced liquid; and passing the vaporized liquid through a vapor nozzle that is fluidly cooperative with a vapor outlet of the vaporization chamber, where a collar with a first portion that forms an annular ring and a second portion that are removably connected to one another is placed in fluid communication with the vaporization chamber such that an outwardly extending first portion of the collar forms a non-filtered single opening with a substantially unobstructed vapor flowpath therethrough such that upon the passage of the vaporized liquid through the collar, it increases a pressure in the vaporization chamber while leaving the conductance of the vapor through the vapor nozzle substantially unchanged, the first portion further defining a first annular flange and the second portion defining a second annular flange that is placed adjacent the first portion such that at least the second portion defines a smaller cross-sectional area than the vapor outlet.

2. The method of claim 1, wherein the outwardly extending first portion further comprises an inwardly extending portion such that the cross-sectional area defining the non-filtered single opening is reduced.

3. The method of claim 2, wherein the inwardly extending portion comprises a flange.

4. The method of claim 2, wherein the inwardly and outwardly extending flanges comprise a single flange.

5. The method of claim 1, wherein the collar further comprises a second portion placed adjacent the first portion, the second portion comprising a second annular flange that defines a smaller cross-sectional area than the non-filtered single opening.

6. The method of claim 1, wherein at least one of the flanges extends outward from the collar.

7. The method of claim 1, wherein at least one of the flanges extends inward from the collar.

8. The method of claim 1, wherein at least one of the flanges extends both inward and outward from the collar.

9. The method of claim 1, wherein the second annular flange has the cross-sectional area less than the cross-sectional area of the vapor nozzle.

10. The method of claim 1, further comprising accumulating material on a substrate placed in fluid communication with the vapor nozzle to permit the average rate of material accumulation to remain substantially unchanged.

11. A method of flash evaporating a liquid, the method comprising:
    introducing the liquid into an inlet of a vaporization chamber that also has a vapor outlet;
    passing the liquid through an atomizer that is configured to ultrasonically vaporize the introduced liquid; and
    passing the vaporized liquid through a vapor nozzle that is fluidly cooperative with the vapor outlet, where a fluid passageway formed at least in part by a collar placed in fluid communication with the vapor outlet and vapor nozzle is defined by an outwardly extending first portion comprising an annular ring with an annular flange removably connected to a second portion comprising an annular flange, the fluid passageway forming a substantially unobstructed vapor flowpath such that upon the passage of the vaporized liquid through the collar, it increases a pressure in the vaporization chamber while leaving the conductance of the vapor through the vapor nozzle substantially unchanged, the annular flanges of the first and second portions being adjacently placed such that at least the second portion defines a smaller cross-sectional area than the vapor outlet.

12. The method of claim 11, further comprising accumulating a material on a substrate that is placed in fluid communication with the vaporization chamber.

13. The method of claim 11, wherein the collar further comprises a second portion placed adjacent the first portion, the second portion comprising a second annular flange.

14. The method of claim 13, wherein at least one of the first and second portions extend inwardly to at least partially define the fluid passageway.

15. A method of depositing a flash evaporated liquid, the method comprising:
    introducing the liquid into an inlet of a vaporization chamber that also has a vapor outlet;
    passing the liquid through an atomizer that is configured to ultrasonically vaporize the introduced liquid;
    passing the vaporized liquid through a vapor nozzle that is fluidly cooperative with the vapor outlet, where a collar with a first portion that forms a flanged annular ring and a second portion that are removably connected to one another is placed in fluid communication with the vapor outlet and vapor nozzle such that an outwardly extending part of the first portion and an adjacently placed flanged part of the second portion defines a non-filtered single opening with a substantially unobstructed vapor flowpath therethrough such that upon the passage of the vaporized liquid through the collar, it increases a pressure in the vaporization chamber while leaving the conductance of the vapor through the vapor nozzle substantially unchanged; and
    accumulating material on a substrate that is placed in fluid communication with the vapor nozzle.

16. The method of claim 15, the vaporization chamber and collar are configured such that an average rate of material accumulation on the substrate remains substantially unchanged relative to no collar being present.

\* \* \* \* \*